(12) United States Patent
Chiu et al.

(10) Patent No.: US 12,431,375 B2
(45) Date of Patent: Sep. 30, 2025

(54) PROTECTION DEVICE FOR SUBSTRATE CONTAINER

(71) Applicant: GUDENG PRECISION INDUSTRIAL CO., LTD., New Taipei (TW)

(72) Inventors: Ming-Chien Chiu, New Taipei (TW); Yung-Chin Pan, New Taipei (TW); Yu-Chen Chu, New Taipei (TW); Chi-Chuan Huang, New Taipei (TW); Cheng-En Chung, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 22 days.

(21) Appl. No.: 18/522,290

(22) Filed: Nov. 29, 2023

(65) Prior Publication Data

US 2024/0371670 A1     Nov. 7, 2024

Related U.S. Application Data

(60) Provisional application No. 63/516,865, filed on Aug. 1, 2023, provisional application No. 63/500,266, filed on May 4, 2023.

(51) Int. Cl.
    *H01L 21/673*     (2006.01)

(52) U.S. Cl.
    CPC .. *H01L 21/67369* (2013.01); *H01L 21/67396* (2013.01)

(58) Field of Classification Search
    CPC ......... H01L 21/67369; H01L 21/67396; H01L 21/67376; H01L 21/673; H01L 21/67383; H01L 21/67386
    USPC ........................... 206/701–711, 832, 44, 454
    See application file for complete search history.

(56) References Cited

U.S. PATENT DOCUMENTS

| | | | | |
|---|---|---|---|---|
| 5,203,454 | A | * | 4/1993 | Strong ................ B65D 25/10 206/565 |
| 5,207,324 | A | * | 5/1993 | Kos .................. H01L 21/67369 206/711 |
| 6,082,540 | A | * | 7/2000 | Krampotich ...... H01L 21/67369 206/711 |
| 7,523,830 | B2 | * | 4/2009 | Burns ............... H01L 21/67369 206/711 |
| 8,118,169 | B2 | * | 2/2012 | Hosoi ............... H01L 21/67369 206/711 |
| 9,698,033 | B2 | * | 7/2017 | Matsutori ......... H01L 21/67376 |
| 12,080,577 | B2 | * | 9/2024 | Kubota ............. H01L 21/67376 |
| 2003/0132133 | A1 | * | 7/2003 | Cheesman ........ H01L 21/67369 206/711 |
| 2006/0060495 | A1 | * | 3/2006 | Chen ................. H01L 21/67369 206/711 |

(Continued)

*Primary Examiner* — Chun Hoi Cheung

(57) ABSTRACT

A protection device for a substrate container includes a container door and a limiter for pushing against and securing a substrate, a support member and an elastic connecting component for engaging and securing the container body, and an antistatic member having elasticity interference to provide an electrostatic dissipation path as electrostatic protection for the substrate. The protection device for a substrate container improves a protection effect of a substrate stored in the substrate container, and prevents hazards to a substrate caused by vibration, dust, and static electricity.

14 Claims, 16 Drawing Sheets

(56) References Cited

U.S. PATENT DOCUMENTS

| | | | | |
|---|---|---|---|---|
| 2006/0283774 A1* | 12/2006 | Hasegawa | ......... | H01L 21/67369 |
| | | | | 206/832 |
| 2010/0025287 A1* | 2/2010 | Lin | ................... | H01L 21/67369 |
| | | | | 206/711 |
| 2010/0025288 A1* | 2/2010 | Lin | ................... | H01L 21/67369 |
| | | | | 206/711 |
| 2010/0038281 A1* | 2/2010 | Lin | ................... | H01L 21/67379 |
| | | | | 206/710 |
| 2010/0108565 A1* | 5/2010 | Lu | .................... | H01L 21/67369 |
| | | | | 206/711 |
| 2010/0258475 A1* | 10/2010 | Ogawa | .............. | H01L 21/67369 |
| | | | | 206/711 |
| 2010/0307957 A1* | 12/2010 | Wiseman | .......... | H01L 21/67369 |
| | | | | 206/711 |
| 2013/0032509 A1* | 2/2013 | Yamagishi | ........ | H01L 21/67379 |
| | | | | 206/711 |
| 2020/0286749 A1* | 9/2020 | Sato | .................. | H01L 21/67373 |
| 2021/0028039 A1* | 1/2021 | Tindel | .............. | H01L 21/67383 |

\* cited by examiner

PROTECTION DEVICE FOR SUBSTRATE CONTAINER

CROSS-REFERENCE TO RELATED APPLICATION

This non-provisional application claims priority under 35 U.S.C. § 119 (e) on U.S. provisional Patent Application No. 63/500,266 filed on May 4, 2023, and No. 63/516,865 filed on Aug. 1, 2023, the entire contents of which are hereby incorporated by reference.

BACKGROUND OF THE INVENTION

1. Field of the Invention

The present disclosure provides a protection device for a substrate container, and more particularly to a protection device for a substrate container to eliminate damage from a substrate carried in the substrate container.

2. Description of the Related Art

Sheet-like products of related electronic devices, for example, sheet-like substrates such as circuit boards, semiconductor wafers, trays, and glass, often need to be accommodated in containers for protection and transportation. Containers that carry these sheet-like substrates of electronic device-related products or semiconductor process-related elements need well-designed substrate container protection measures, so as to prevent substrates stored and carried therein from damage.

A conventional substrate carrier that carries a non-circular substrate is provided with a door, on which a limiter for limiting displacement of substrates is provided. When the non-circular substrate is accommodated in a carrier space in the substrate container, a distance of the non-circular substrate to an opening of the substrate container is greater than a distance of a circular substrate to the opening of the substrate container. Thus, the structure of the limiter needs to be designed to protrude from an inner surface of the door in order to push against a side edge of the non-circular substrate and hence secure the substrate in the substrate container, preventing vibration or swaying of the substrate during a transportation process. However, when the substrate carrier is transported to a load port and the door needs to be opened in order to take out or place in the substrate, due to the limiter protruding from the inner surface of the door, a mechanical arm encounters interference while taking out and placing in the door to the load port, further resulting in anomalies in operations.

Moreover, a support member is provided in a conventional substrate container, and multiple trays are further provided on the support member to carry substrates, for example, for carrying a non-circular substrate, wherein substrates may be repeatedly carried and transported using stacked trays. However, the overall weight of the trays used for carrying the substrates in the substrate container is much heavier than the weight of a substrate container without these trays. Thus, the support member is likely to receive a downward force of action due to weight during carrying and transportation processes. This can result in a gap being generated at a connection point between the support member and the substrate container, or the support member may even fall from the inside of the substrate container in a way that substrates may become damaged.

In additional to mechanism interference and dust contamination caused by friction, substrate damage and functional impairment caused by static electricity interference are also considered as key issues. Currently, no conventional substrate container for carrying substrates and trays that provides a solution for the issue of electrostatic damage.

Therefore, there is need for a solution to solve numerous issues, including wear and dust contamination by vibration or friction of substrates, as well as microstructure damage or functional impairment produced by electrostatic interference.

BRIEF SUMMARY OF THE INVENTION

It is an objective of the present disclosure to improve a structural design of a limiter so as to overcome disadvantages of a conventional substrate container including a limiter for pushing against a substrate. During the process of moving the door to allow interaction with an automation system, interference results due to the limiter protruding from the inner surface of the door, further leading to the issue of operation anomalies.

It is another objective of the present disclosure to improve a structural design for a support member so as to solve the issue of risks of substrate damage caused by dust produced by vibration and friction of substrates.

It is yet another objective of the present disclosure to provide a novel antistatic element so as to solve the issue of electrostatic damage of substrates in a substrate container.

According to an embodiment of the present disclosure, a protection device for a substrate container suitable for a substrate container is provided. The substrate container includes a container body and a container door. The container door is adapted to be opened and closed with the container body. The container body is provided therein with at least one support member and a storage section for accommodating a substrate. The container door is provided with a recessed portion. The protection device for a substrate container includes a limiter, disposed at the recessed portion of the container door. The limiter includes a base disposed at the container door and at least one movable piece pivotally connected to the base. The movable piece includes a pivot side which is a first portion and a free side which is a second portion. The pivot side is for pushing against the support member of the container body, and the free side extends outward correspondingly according to a push force of the pivot side and pushes against the substrate. Alternative the free side withdraws inward, such that a height of a top surface of the limiter toward the storage section is less than a height of an inner surface of the container door.

In an embodiment, the limiter further includes an elastic element disposed between the base and the movable piece. The elastic element provides an elastic variance for a movement state of extending the free side outward according to a push force of the pivot side or withdrawing the free side inward.

In an embodiment, when two movable piece are used, the pivot sides of the two movable pieces are in a staggered arrangement and are for pushing against the support member located at the container body.

In an embodiment, the protection device for a substrate container further includes a fastening component. The fastening component is disposed at the recessed portion of the container door and is detachably installed with the limiter.

In an embodiment, the protection device for a substrate container further includes a limiting element. The limiting element is disposed at the recessed portion of the container body, and is for fixing the limiter.

According to an embodiment of the present disclosure, a protection device for a substrate container suitable for a substrate container is provided. The substrate container includes a container body and a container door. The container door is adapted to be opened and closed with the container body. The container body includes a plurality of card slots for correspondingly disposing the support member. The protection device for a substrate container includes the limiter according to the embodiment above, and a plurality of support members for supporting the substrate. Each of the support members includes a protrusion, located on a top surface of the support member, the protrusions for corresponding placing into the plurality of card slots. A reinforcement support portion, disposed on the protrusion, and the reinforcement support portion including a rigid connecting component and an elastic connecting component include an extension portion and a hooking portion. One end of the extension portion is connected to the rigid connecting component, and the other end of the extension portion is connected to the hooking portion. The hooking portion is hooked with the card slot of the container body. A hardness of the rigid connecting component is greater than that of the elastic connecting component.

In an embodiment, the rigid connecting component is embedded in the protrusion.

According to an embodiment of the present disclosure, a protection device for a substrate container suitable for a substrate container is provided. The substrate container includes a container body, a base and at least one support member. The base is disposed at a bottom of the container body. The support is disposed in a storage section of the container body. The base and the support member are formed of electrostatic dissipative materials. The protection device for a substrate container includes the limiter described above and at least one antistatic element disposed between the bottom of the container body and the base. The antistatic element includes a fixing portion disposed at the bottom of the container body and connected to the support member, and an elastic connecting component, with one end connected to the fixing portion and another end elastically pushing against an inner surface of the base, wherein the support member, the antistatic element, and the base define an electrostatic dissipation path.

In an embodiment, the bottom of the container body and the base define an interference elimination structure. The interference elimination structure is disposed at the bottom of the container body located below the support member, and the antistatic element is disposed at a position in the interference elimination structure.

In an embodiment, when a plurality of antistatic elements and a plurality of support members are provided, the plurality of antistatic elements is correspondingly arranged at positions of the plurality of supports.

In an embodiment, the antistatic element further includes a conductive bridging component. The conductive bridging component is for connecting the fixing portion to the support member via the bottom of the container body.

In an embodiment, a top surface of the conductive bridging component is lower than a height of a top surface of the fixing portion toward the base.

In an embodiment, the conductive bridging component is a metal screw, and locks the fixing portion to a bottom of the support member via the bottom of the container body.

In an embodiment, the fixing portion is fixedly connected at the conductive bridging component, such that the antistatic element is allowed to be connected to the support member via the bottom of the container body.

In an embodiment, the fixing portion has a screw hole and the metal screw is correspondingly locked with the screw hole, such that the antistatic element can be connected to the support member via the bottom of the container body.

With the protection device for a substrate container of the present disclosure, in addition to ensuring that a substrate is clamped and fixed by the limiter to prevent generating any displacement or vibration when the substrate is stored and carried in the substrate container, the arrangement of the limiter achieves various effects including keeping a mechanism and components free from interfering with each other, effectively securing the substrate, and providing electrostatic protection. Thus, the objective of protecting the substrate in the substrate container is achieved, and safety of the substrate carried or transported in the substrate container is also enhanced.

DETAILED DESCRIPTION OF THE INVENTION

The technical contents of the present disclosure are to be further described in detail by way of embodiments with the accompanying drawings below. It should be noted that, in the present disclosure, terms such as "first", "second", and "third" are used to distinguish differences among elements, and are not to be construed as limiting to the elements themselves and specific orders of the elements. Moreover, in the present disclosure, a specific number is specified, the article "a/an/one" refers to one element or more.

To fully understand the objects, features and effects of the present disclosure, the present disclosure is described in detail by way of specific embodiments with the accompanying drawings.

Figure 1A:
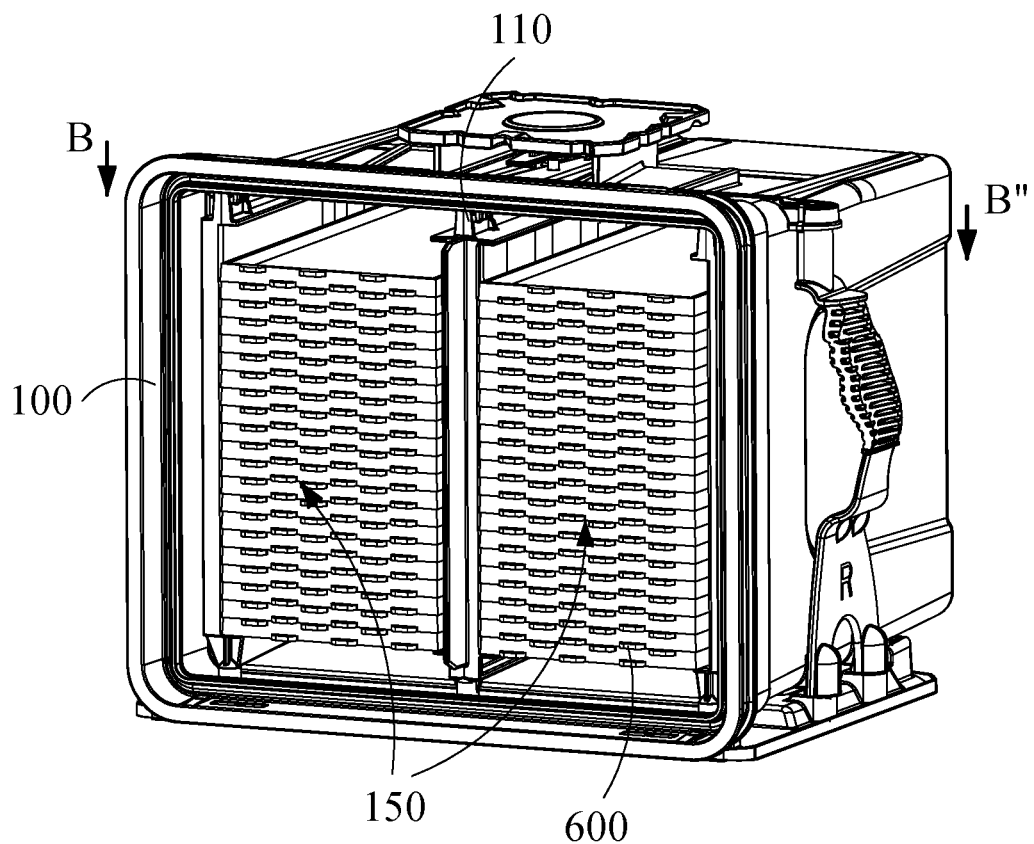
FIG. 1A is a perspective schematic diagram of a container body suitable for a protection device for a substrate container according to an embodiment of the present disclosure.
Figure 1B:
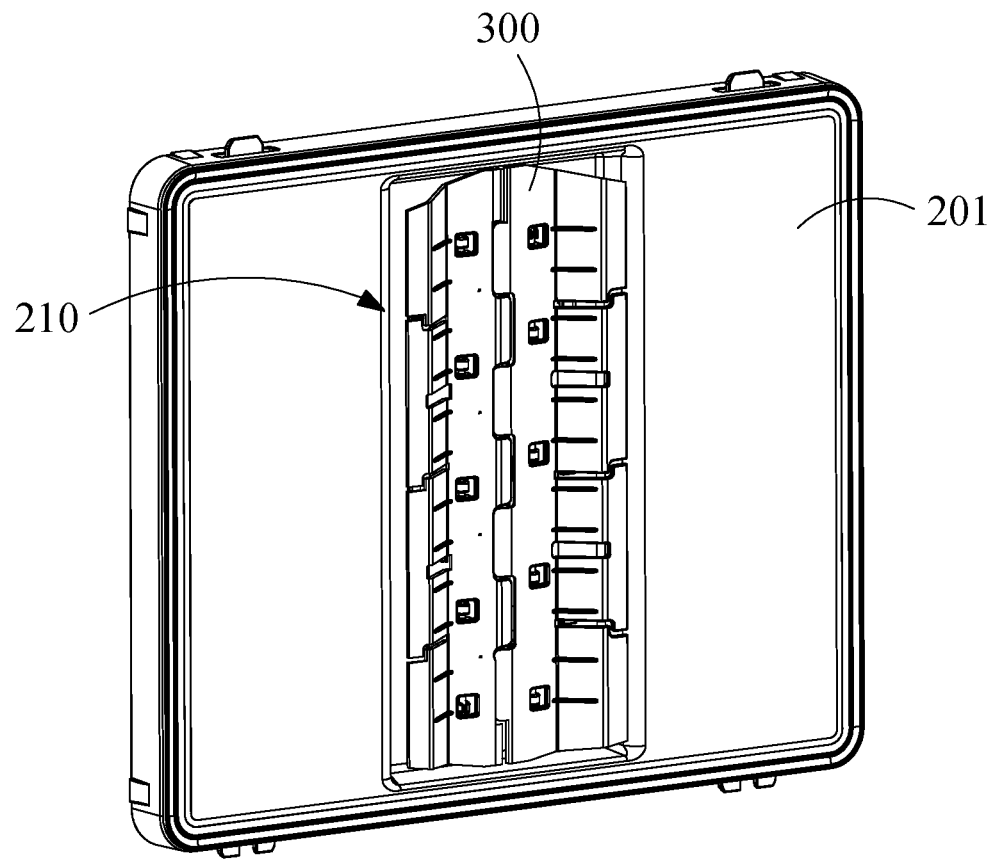
FIG. 1B is a perspective schematic diagram of a container door suitable for a protection device for a substrate container according to an embodiment of the present disclosure.
Figure 2:
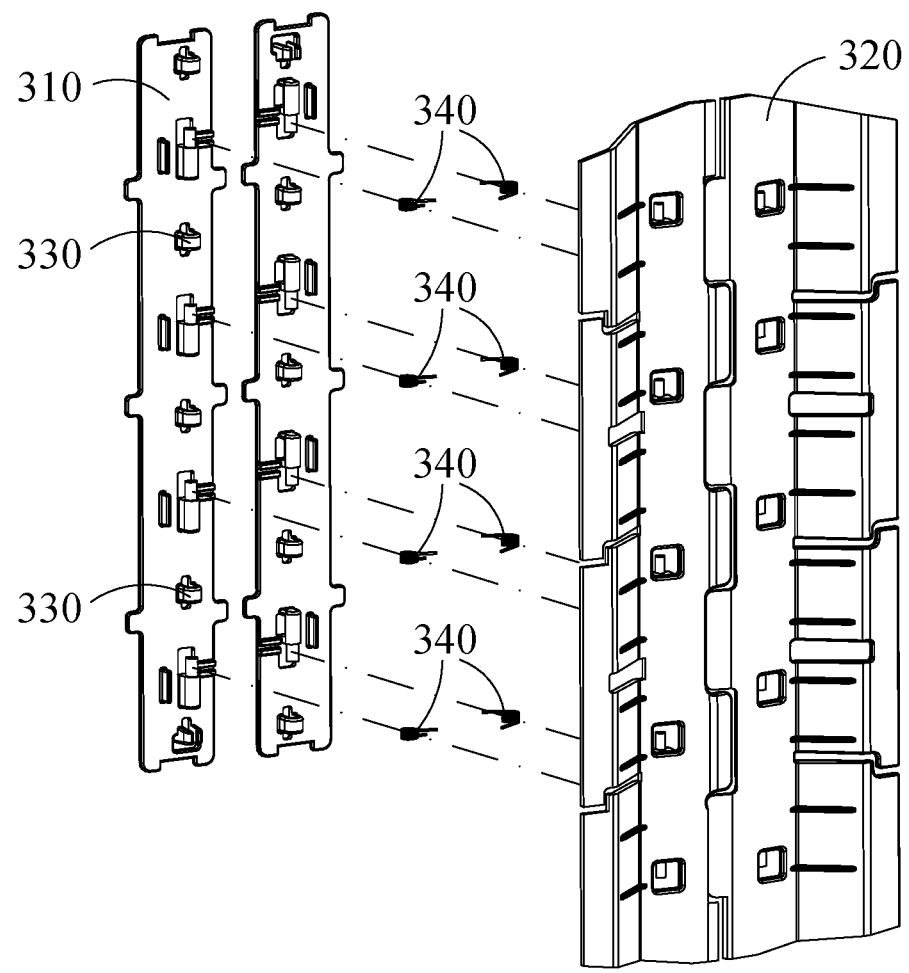
FIG. 2 is an exploded schematic diagram of a limiter of a protection device for a substrate container according to an embodiment of the present disclosure.
Figure 3:
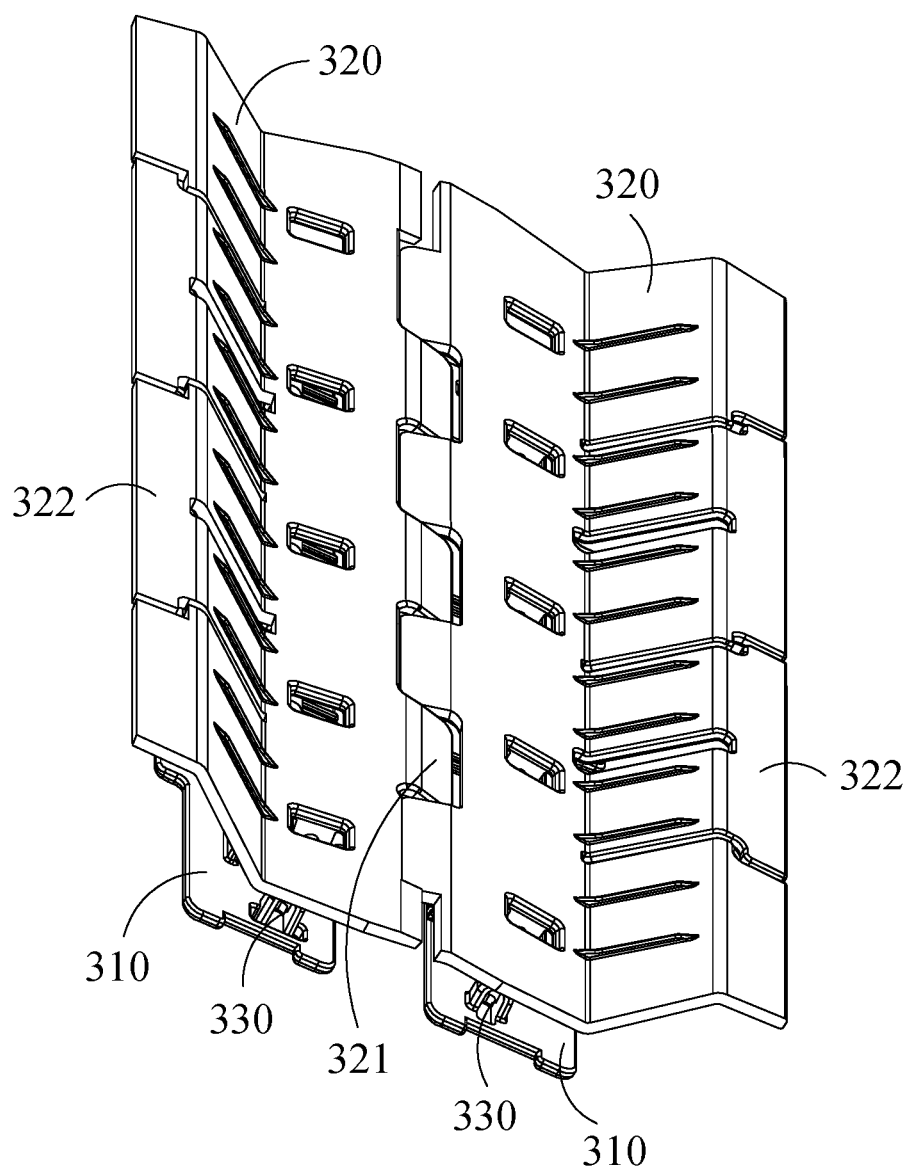
FIG. 3 is a perspective schematic diagram of a limiter of a protection device for a substrate container according to an embodiment of the present disclosure.
Figure 4:
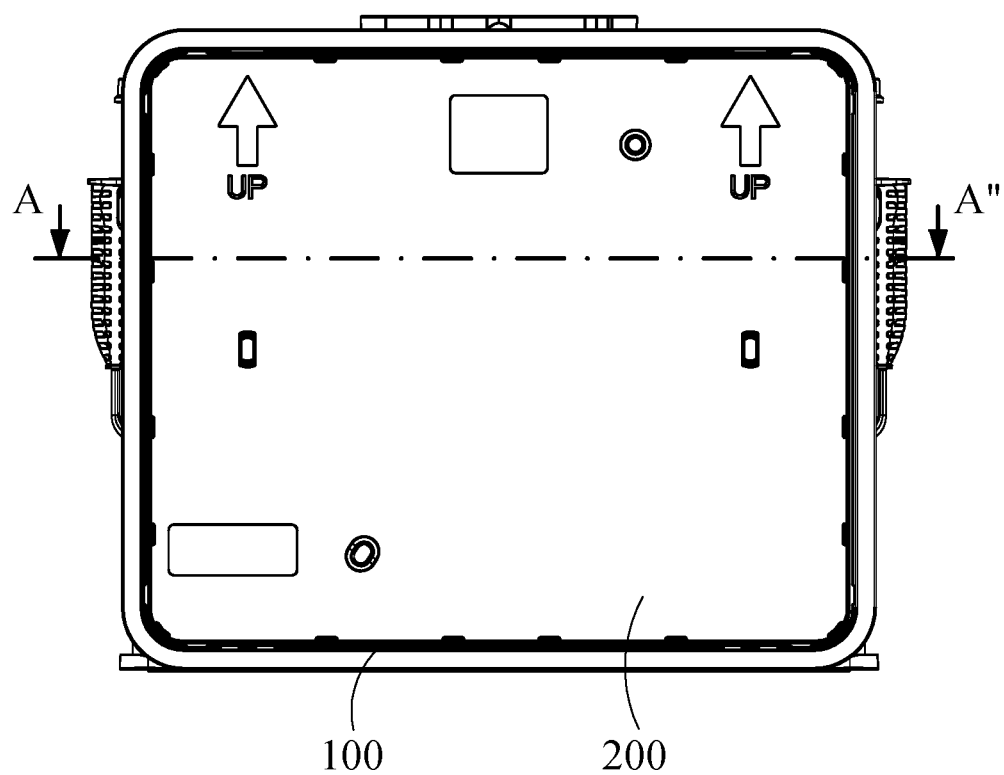
FIG. 4 is a front schematic diagram of a substrate container suitable for a protection device for a substrate container according to an embodiment of the present disclosure.

Refer to FIG. 1 to FIG. 4. FIG. 1A shows a perspective schematic diagram of a container body 100 suitable for a protection device for a substrate container according to an embodiment of the present disclosure. FIG. 1B shows a perspective schematic diagram of a container door 200 of a protection device for a substrate container according to an embodiment of the present disclosure. FIG. 2 shows an exploded schematic diagram of a limiter of a protection device for a substrate container according to an embodiment of the present disclosure. FIG. 3 shows a perspective schematic diagram of a limiter of a protection device for a substrate container according to an embodiment of the present disclosure. FIG. 4 shows a front schematic diagram of a substrate container 10 suitable for a protection device for a substrate container according to an embodiment of the present disclosure.

The substrate container 10 includes a container body 100. The container body 100 is provided therein with at least one support member 110 and a storage section 150 for accommodating a substrate 600. In an embodiment, the substrate 600 is, for example, a non-circular sheet-like product, such as a semiconductor wafer or a circuit board carried on a tray.

In an embodiment, multiple substrates 600 stacked on one another can be accommodated, so a plurality of support members 110 is correspondingly arranged in accordance with the requirement for storing the substrates 600. Moreover, to accommodate two groups of a plurality of substrates 600 stacked on one another for example, in order to provide a sufficient substrate supportability. For example, three supports 110 are distributed at intervals in the container body 100 and are arranged on adjacent sides of the two groups of substrates 600 stacked on one another.

The substrate container 10 includes the container door 200, which is adapted to be closed with the container body 100. The container door 200 is provided with a recessed portion 210 on an inner surface 201 facing a direction of the storage section 150. The protection device for a substrate container includes a limiter 300 disposed in the recessed portion 210 of the container door 200. The structure of the limiter 300 is described in detail below. The limiter 300 includes a base 310 and at least one movable piece 320. The base 310 is disposed at the recessed portion 210 of the container door 200 and away from the inner surface 201 of the container door 200. For example, the number of the movable pieces 320 is two, to coordinate with and push against the two groups of the plurality of substrates 600 stacked on one another. The movable piece 320 includes a pivot side 321 which is a first portion, and a free side 322 which is a second portion connected to the pivot side 321. Each movable piece 320 is pivotally connected to the base 310 by a pivotal shaft 330, and the pivot sides 321 of the two movable pieces 320 are staggered from one another.

The limiter 300 further includes an elastic element 340 disposed between the base 310 and the movable piece 320. The elastic element 340 provides an elastic variance for a movement state for outward expansion according to a push force of the pivot side 321 and inward withdrawal of the free side 322. The elastic element 340 is a spring, a torsion spring, or other elements capable of storing and releasing elastic potential energy. The pivot side 321 is for pushing against the support member 110 of the container body 100. Herein, the pivot side 321 pushes against the support member 110 at a center position of the storage section 150. The free side 322 corresponds to the positions of the two groups of the plurality of substrates 600 stacked on one another. For example, the pivot side 321 and the free side 322 of the movable piece 320 operate according to a principle of a seesaw by using the pivotal shaft 330 as a fulcrum. When the pivot side 321 ascends, the free side 322 correspondingly descends, and vice versa. When the pivot side 321 pushes against the support member 110, the free side 322 correspondingly extends outward according to a push force of the pivot side 321 and pushes against the substrate 600, or the free end 322 withdraws inward, such that a height of a top surface of the limiter 300 facing the storage section 150 is less than a height of the inner surface 201 of the container door 200. That is, when the free side 322 withdraws inward, an overall height of the entire limiter 300 is located within the recessed portion 210 and does not exceed a plane height of the inner surface 201 of the container door 200.

Next, how the novel structural design of the limiter of the present disclosure is applied to solve the issue of a conventional substrate container including a limiter for pushing against a substrate is described below. During the process of moving the door for loading or unloading by an automation system, interference results due to the limiter protruding from the inner surface of the door, further leading to the issue of an operation anomaly. In an embodiment of the present disclosure, the elastic element 340 causes the pivot side 321, which is the first portion of the movable piece 320, to be kept at a protruding position relative to the free side 322, which is the second portion. Moreover, in the present disclosure, a state in which the pivot side 321, having a higher and more protruding height compared to the free side 322, is defined as a first state position. When the pivot side 321, which is the first portion of the movable piece 320, receives a force and is pressed downward, the free side 322, which is the second portion of the movable piece 320, is lifted to a position protruding by a greater height relative to the pivot side 321, which is the first portion. In the present disclosure, a state in which the free side 322, which is the second portion, has a higher and more protruding height compared to the pivot side 321, which is the first portion, is defined as a second position state.

Figure 5A:
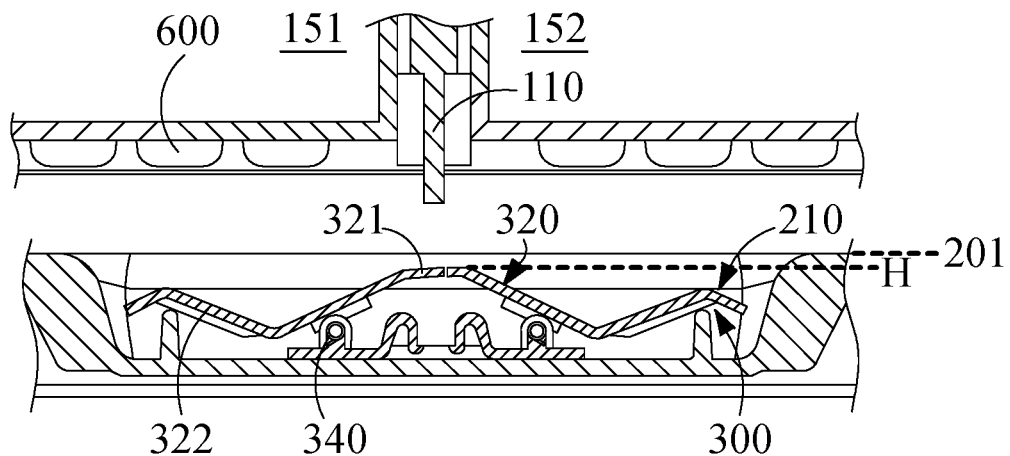
FIG. 5A is a cross-section schematic diagram of a limiter of a protection device for a substrate container in operation according to an embodiment of the present disclosure along the line A-A" in FIG. 4.
Figure 5B:
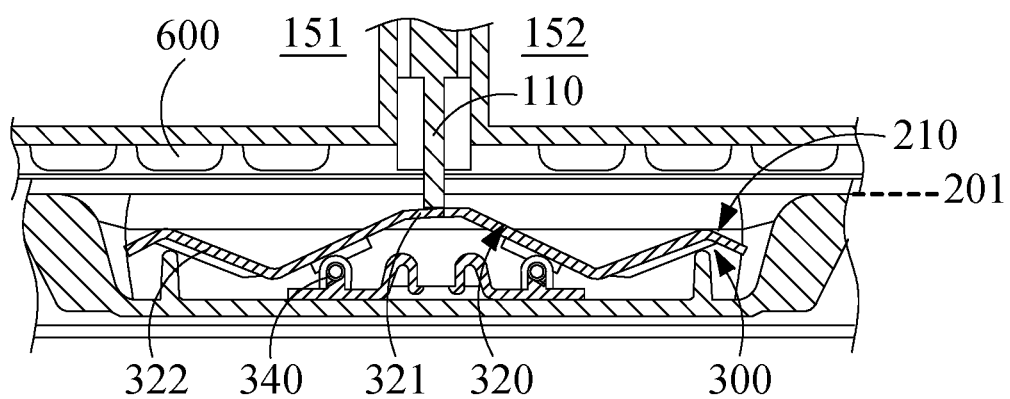
FIG. 5B is a cross-section schematic diagram of a limiter of a protection device for a substrate container in operation according to an embodiment of the present disclosure along the line A-A" in FIG. 4.
Figure 5C:
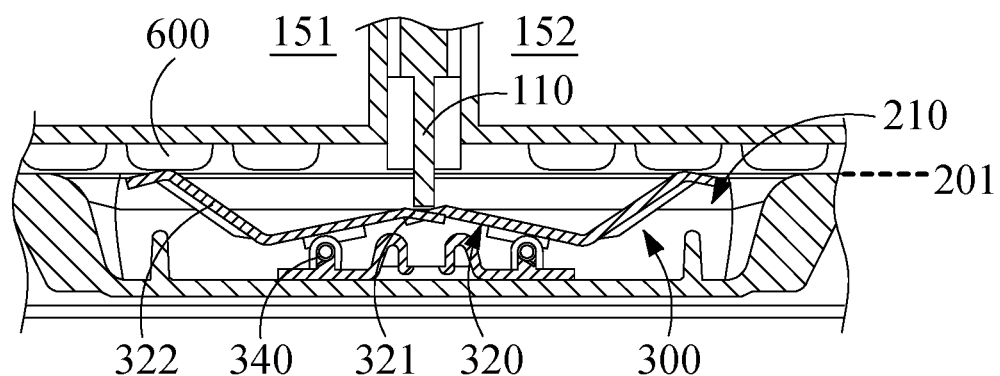
FIG. 5C is a cross-section schematic diagram of a limiter of a protection device for a substrate container in operation according to an embodiment of the present disclosure along the line A-A" in FIG. 4.

FIG. 5A to FIG. 5C show section schematic diagrams of a limiter of a protection device for a substrate container in operation according to an embodiment of the present disclosure along the line A-A" in FIG. 4. FIG. 5A shows the support member 110 not yet in contact with the movable piece 320 of the limiter 300, that is, when the movable piece 320 is at the first state position. FIG. 5B shows the support member 110 has just come into contact with the pivot side 321 which is the first portion of the movable piece 320 of the limiter 300, that is, when the movable piece 320 starts to transition from the first state position to a second state position. FIG. 5C shows the support member 110 already pushing and pressing against the pivot side 321 which is the first portion of the movable piece 320 of the limiter 300, that is, when the movable piece 320 is at the second state position. When the movable piece 320 is at the first state position, the pivot side 321, which is the first portion of the movable piece 320, is at a farthest point of the entire limiter 300 and the movable piece 320 from the bottom 310. In other words, the pivot side 321, which is the first portion of the movable piece 320, is a highest point of the entire component, so as to ensure that the pivot side 321, which is the first portion, is first pressed against by and in contact with other corresponding components (for example, the support member 110). In an embodiment, pressing against and coming into contact with the support member 110 located at the center.

In an embodiment of the present disclosure, the support member 110 is provided in each of two inner sides and the center position of the container body 100, and is arranged at positions on two sides and the center position of the container body 100. Two storage sections are respectively defined between every two adjacent support members 110, and are differentiated as a first load-bearing portion 151 and a second load-bearing portion 152 respectively carrying and keeping the substrates 600. As shown in FIG. 5A, when the container door 200 is removed from the container body 100, the pivot side 321 does not receive any push force, and so the elastic element 340 exhibits an elastically relaxed state. At this point, the movable piece 320 is at the first state position, that is, the pivot side 321 is a portion having a highest height (a most protruding portion) in the entire limiter 300, and a height H of the top surface of the pivot side 321 does not exceed the height of the inner surface 201 of the container door 200. Since the entire limiter 300 is located in the recessed portion 210, when a mechanical arm removes or opens the container door 200 and places it into a load port, the container door 200 is not at all interfered by the limiter 300 and can be smoothly taken out, accordingly overcoming the issue of system anomaly conventionally caused by interference from a limiter.

As shown in FIG. 5B and FIG. 5C, when the door container 200 approaches the container body 100, the pivot side 321, which is the first portion of the movable piece 320, first comes into contact with the support member 110 located at the center position. As the container door 200 gets closer to the storage section of the container door 200, the pressing force applied by the support member 110 upon the pivot side 321, which is the first portion, increases. At this point, the elastic element 340 stores elastic potential energy due to the elastic compression. Meanwhile, the elastic element 340 drives and rotates the pivotal shaft 330 on the base 310, such that the free side 322, which is the second portion, is driven away from the base 310 of the limiter 300 and extends outward to approach the first load-bearing portion 151 and the second load-bearing portion 152, until the container door 200 is completely closed with the container body 100. At this point, the movable piece 320 is at the second state position, that is, an amplitude by which the free side 322 extends toward the storage section is exactly sufficient to push against and secure the substrates 600 in the first load-bearing portion 151 and the second load-bearing portion 152. When the container door 200 is released from the closed state and is opened again, the support member 110 releases the force applied on the pivot side 321, which is the first portion, such that the elastic element 340 releases the elastic potential energy to allow the movable piece 320 to return to the state shown in FIG. 5A, that is, the first state position. Meanwhile, the pivotal shaft 330 on the base 310 rotates pivotally, and the free end 322, which is the second portion, also returns to an original position.

Figure 6A:
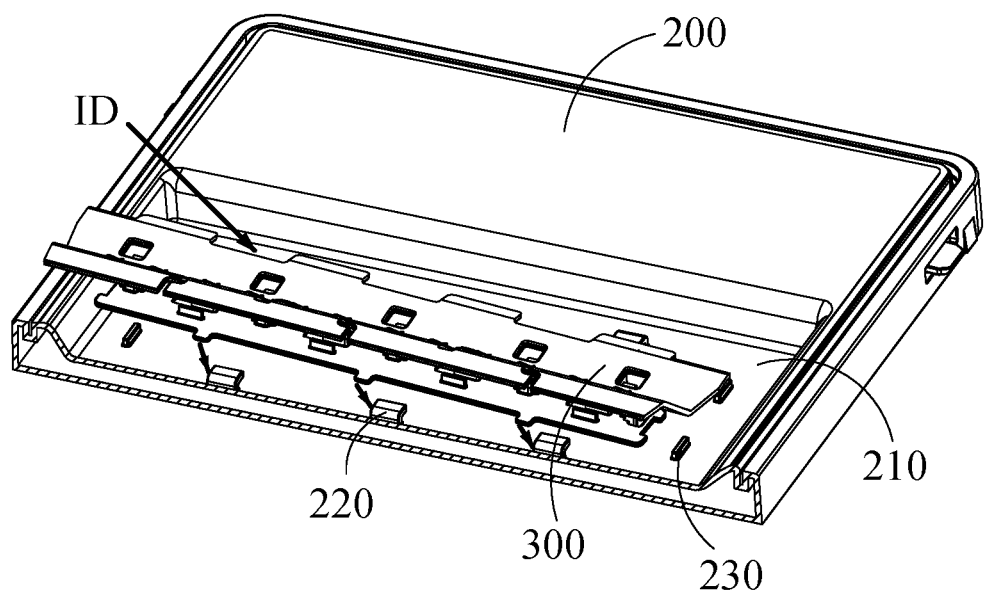
FIG. 6A is a schematic diagram of a state before a limiter of a protection device for a substrate container is assembled to a container door according to an embodiment of the present disclosure.
Figure 6B:
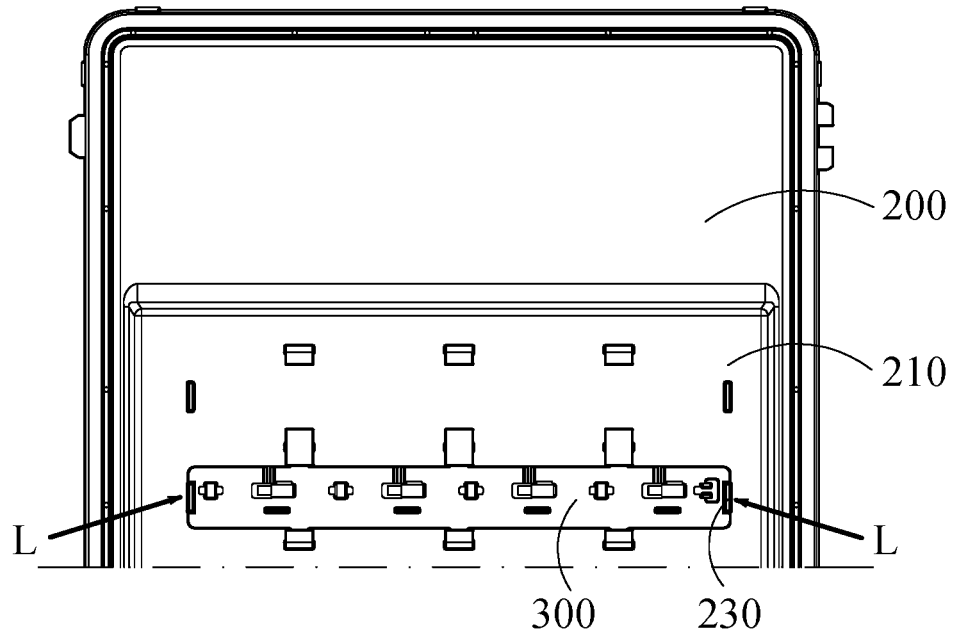
FIG. 6B is a schematic diagram of a state after a limiter of a protection device for a substrate container is assembled to a container door according to an embodiment of the present disclosure.

FIG. 6A and FIG. 6B are schematic diagrams of states before and after a limiter of a protection device for a substrate container is assembled to a container door according to an embodiment of the present disclosure. In an embodiment of the present disclosure, the protection device for a substrate container further includes a fastening component 220 disposed at the recessed portion 210 of the container door 200. The limiter 300 can be embedded into the fastening component 220 and be assembled to the recessed portion 210 of the container door 200 by means of fitted fastening. For example, the limiter 300 is embedded into the fastening component 220 in an installation direction ID, thereby elastically removing or installing the limiter 300 according to requirements. The protection device for a substrate container further includes a limiting component 230 disposed at the recessed portion 210 of the container door 200. As shown by the arrows in FIG. 6B, the limiting component 230 can provide a limiting position L of the limiter 300 to prevent the limiter 300 from sliding off or falling off unexpectedly due to vibration or other reasons.

Figure 7A:
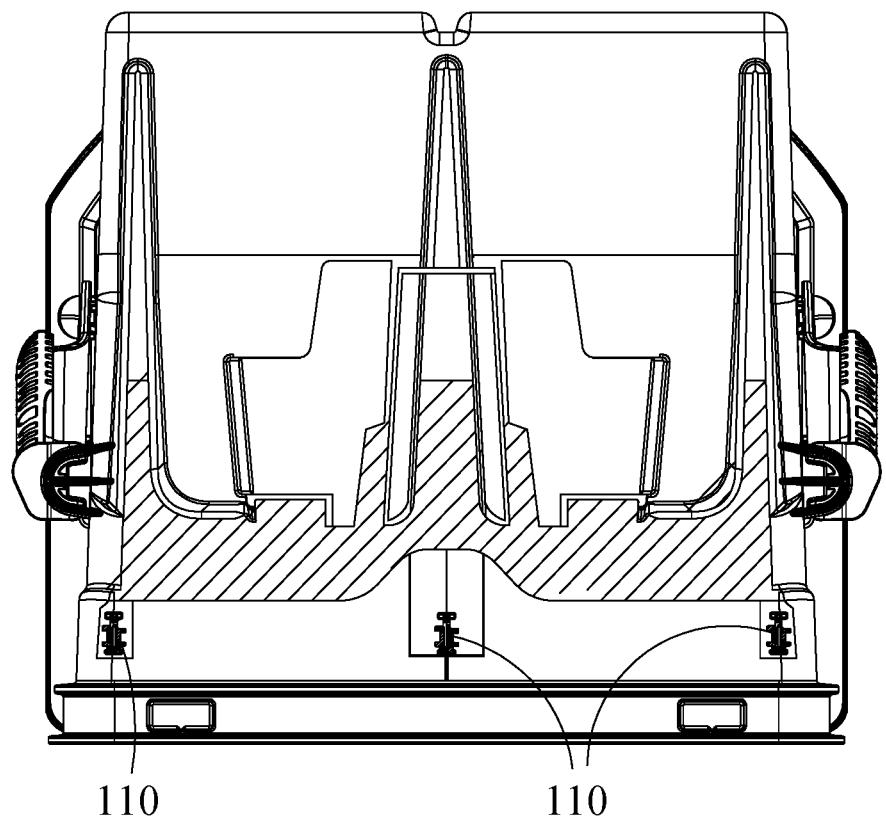
FIG. 7A is a section plan schematic diagram along the line B-B" in FIG. 1A.
Figure 7B:
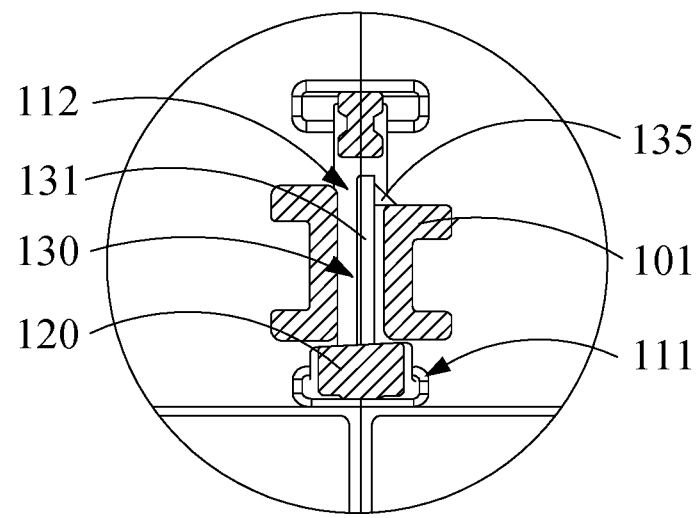
FIG. 7B is an enlarged partial schematic diagram of a support member in FIG. 7A.
Figure 7C:
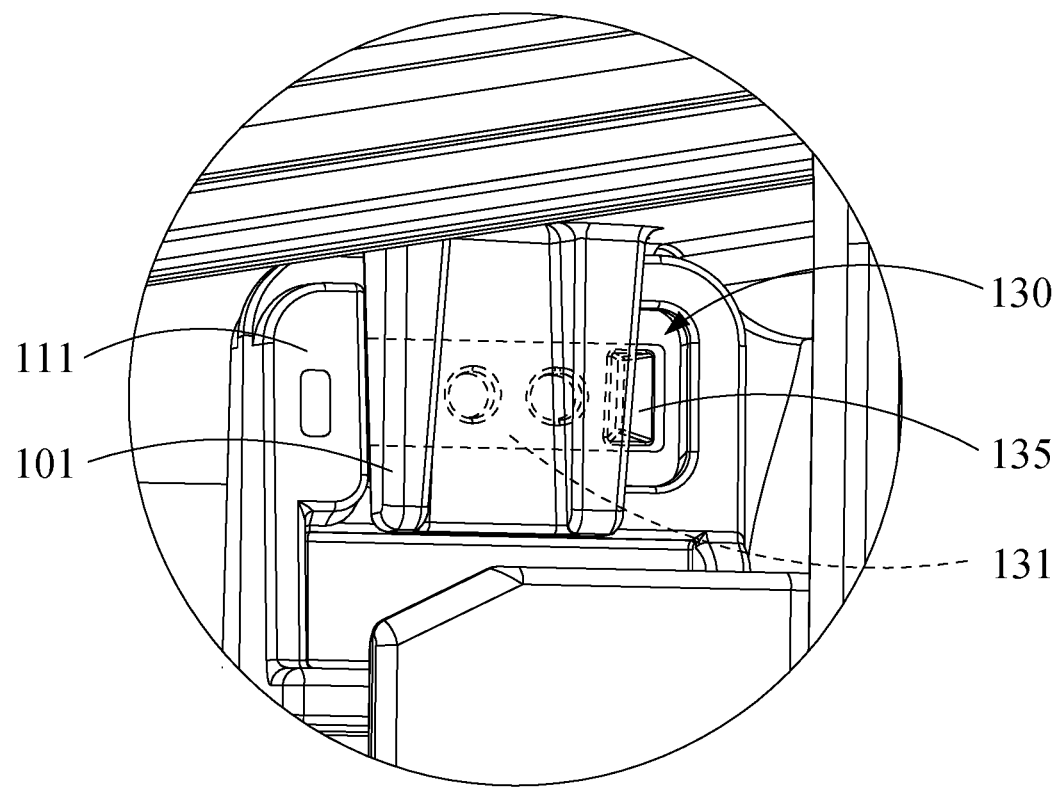
FIG. 7C is an enlarged partial perspective schematic diagram of a support member in FIG. 7A.
Figure 8A:
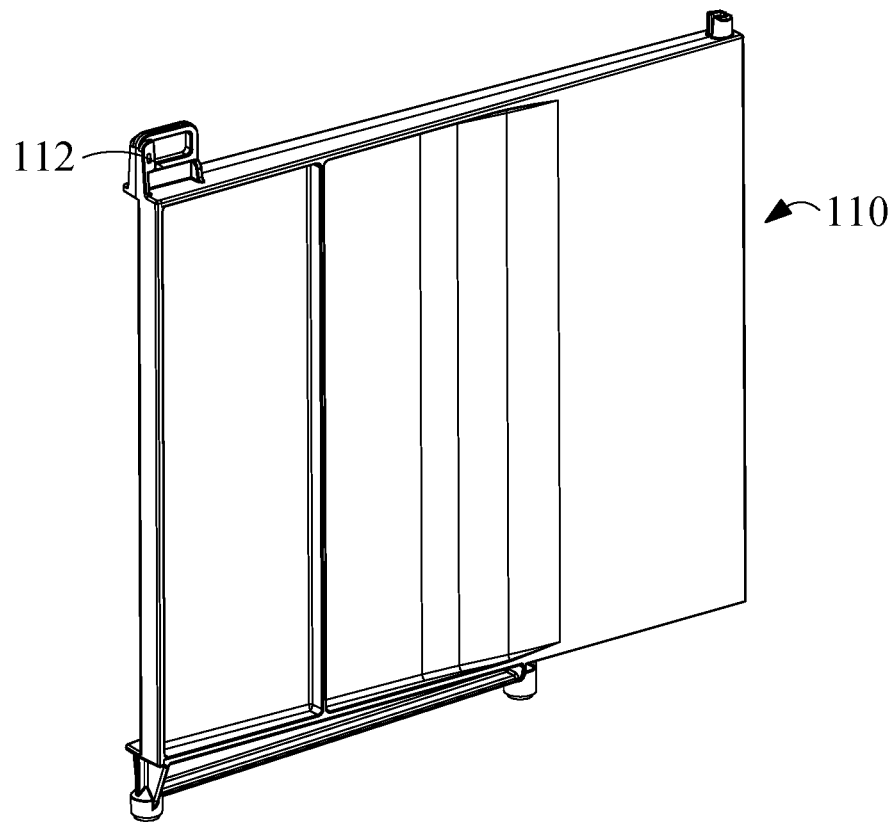
FIG. 8A is a perspective schematic diagram of a support member of a protection device for a substrate container according to an embodiment of the present disclosure.
Figure 8B:
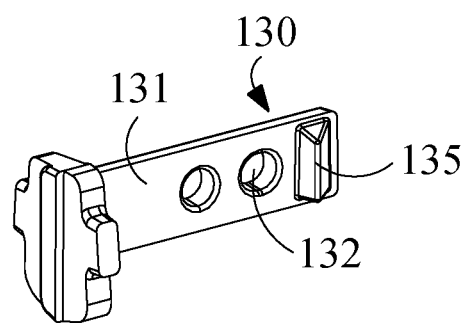
FIG. 8B is a perspective schematic diagram of an elastic connecting component of a protection device for a substrate container according to an embodiment of the present disclosure.
Figure 8C:
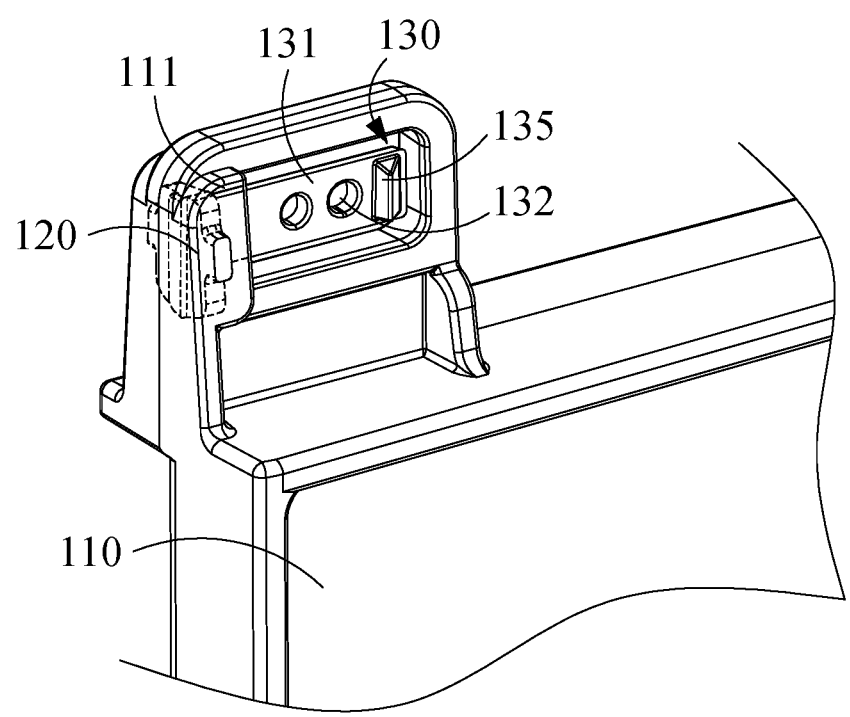
FIG. 8C is a perspective schematic diagram of an elastic connecting component of a protection device for a substrate container connected to a rigid connecting component according to an embodiment of the present disclosure.

The present disclosure further provides a solution for solving the issues of dust contamination or substrate damage caused by gaps, vibration and friction between a conventional support member and the substrate container due to unstable support. This embodiment is suitable for the substrate container and the limiter described above, so the same element structures and the same element numerals and functions are omitted herein for brevity, and only the differences are described. Refer to FIG. 7A to FIG. 8C. FIG. 7A shows a section plan schematic diagram along the line B-B" in FIG. 1A. FIG. 7B shows an enlarged partial schematic diagram of the support member 110 in FIG. 7A. FIG. 7C shows an enlarged partial perspective schematic diagram of the support member 110 in FIG. 7A. FIG. 8A shows a perspective schematic diagram of a support member of a protection device for a substrate container according to an embodiment of the present disclosure. FIG. 8B shows a perspective schematic diagram of an elastic connecting component of a protection device for a substrate container according to an embodiment of the present disclosure. FIG. 8C shows a perspective schematic diagram of an elastic connecting component of a protection device for a substrate container connected to a rigid connecting component according to an embodiment of the disclosure.

The container body 100 includes a plurality of card slots 101, and the protection device for a substrate container includes a plurality of support members 110 for supporting the substrates 600. Each support member 110 includes a protrusion 111 and a reinforcement support portion 112. The protrusion 110 is located at the top surface of the support member 110, and is for correspondingly placing into the card slot 101 of the container body 100, so as to secure the support member 110 in the container body 100 through the card slot 101. The reinforcement support portion 112 is disposed on the protrusion 111, and includes a rigid connecting component 120 and an elastic connecting component 130. The elastic connecting component 130 includes an extension portion 131 and a hooking portion 135. One end of the elastic portion 131 is connected to the rigid connecting component 120, and the other end of the extension portion 131 is connected to the hooking portion 135. The hooking portion 135 is hooked with the card slot 101 of the container body 100. As shown in FIG. 7B and FIG. 7C, the extension portion 131 extends out of the card slot 101, and the hooking portion 135 hooks at an outer side of the card slot 101, so as to provide the support member 110 with a clamping effect for stabilizing the support member 110 in the container body 100. For better illustration, the card slot 101 in FIG. 7C is perspectively depicted such that the extension portion 131 of the elastic connecting component 130 is visible. The rigid connecting component 120 is formed of a material having a hardness greater than a hardness of a material forming the elastic connecting component 130. The rigid connecting component 120 can be embedded in the protrusion 111 for stable securing. The rigid connecting component 120 and the support member 110 can be formed of the same material. The rigid connecting component 120 and the support member 110 are, for example but not limited to, integrally formed.

More specifically, when the support member 110 is to be assembled to the container body 100, the entire support member 110 is slid in parallel into the storage section 150 from an opening of the container body 100 to correspondingly place the protrusion 111 into the card slot 101. At this point, the hooking portion 135 of the elastic connecting component 130 protrudes from the side surface of the protrusion 111, such that the hooking portion 135 receives a force to elastically deform the elastic connecting component 130, until the support member 110 is completely fitted and fastened with the container body 100. At this point, the elastic connecting component 130 releases the elastic deformation such that the hooking portion 135 hooks at the outer side of the card slot 101, so as to prevent the support member 110 from disengaging from the container body 100. The elastic element 130 serves as a connection member and a buffer between the rigid support member 120 and the card slot 101, and provides connection and fixing effects as well as absorption for forces of impact and friction between the two. Thus, the entire support member 110 can be stably fastened in the container body 100 without resulting friction that may generate dust, cracking, and aging of elements due to impacts are prevented, and the support member 110 does not fall off from the container body 100 even in the event of vibration.

In an embodiment of the present disclosure, the extension portion 131 of the elastic connecting component 130 has a hole 132 to enhance the elasticity of the extension portion 131 and to increase a level of tolerance for deformation of the elastic material.

In an embodiment of the present disclosure, the rigid connecting component 120 is formed of a mixture of polycarbonate (PC), carbon fiber, and APWA, and has a better rigidity compared to the elastic connecting component 130.

In an embodiment of the present disclosure, the elastic connecting component 130 can be formed of a combination of PC and a nanotube material, has a better elasticity compared to the rigid connecting component 120, and does not easily produce dust as being unlikely to generate friction against the container body 100. However, the present disclosure is not limited to the examples above. The materials of the rigid connecting component 120 and the elastic connecting component 130 can be adjusted and modified according to requirements. However, the hardness of the material forming the rigid connecting component 120 needs to be greater than that of the elastic connecting component 130, so as to prevent the reinforcement support portion 112 from breaking off from the protrusion 111.

Thus, with the protection device for a substrate container of the present disclosure including the support member having coordination of the elastic connecting component and the rigid connecting component, the substrate container is able to appropriately carry weight and be stably fixedly connected to the container body without incurring issues of dust contamination or damage caused by gaps, vibration, or friction.

Figure 9:
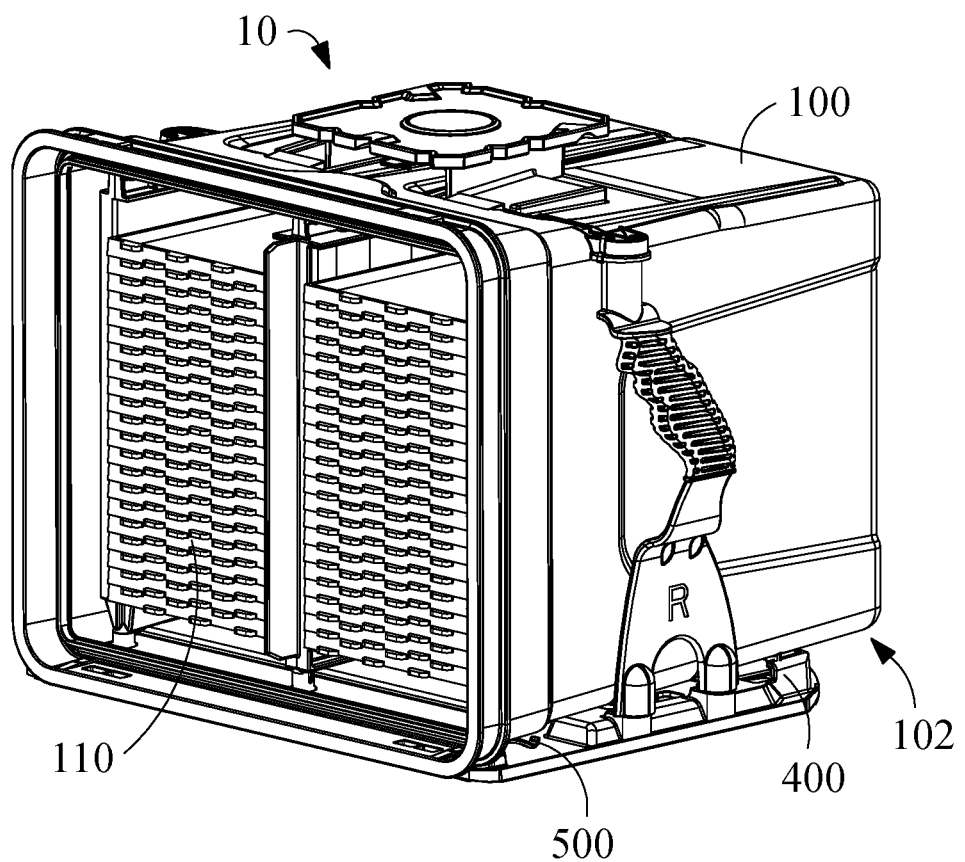
FIG. 9 is a perspective schematic diagram of a substrate container suitable for a protection device for a substrate container according to an embodiment of the present disclosure.
Figure 10:
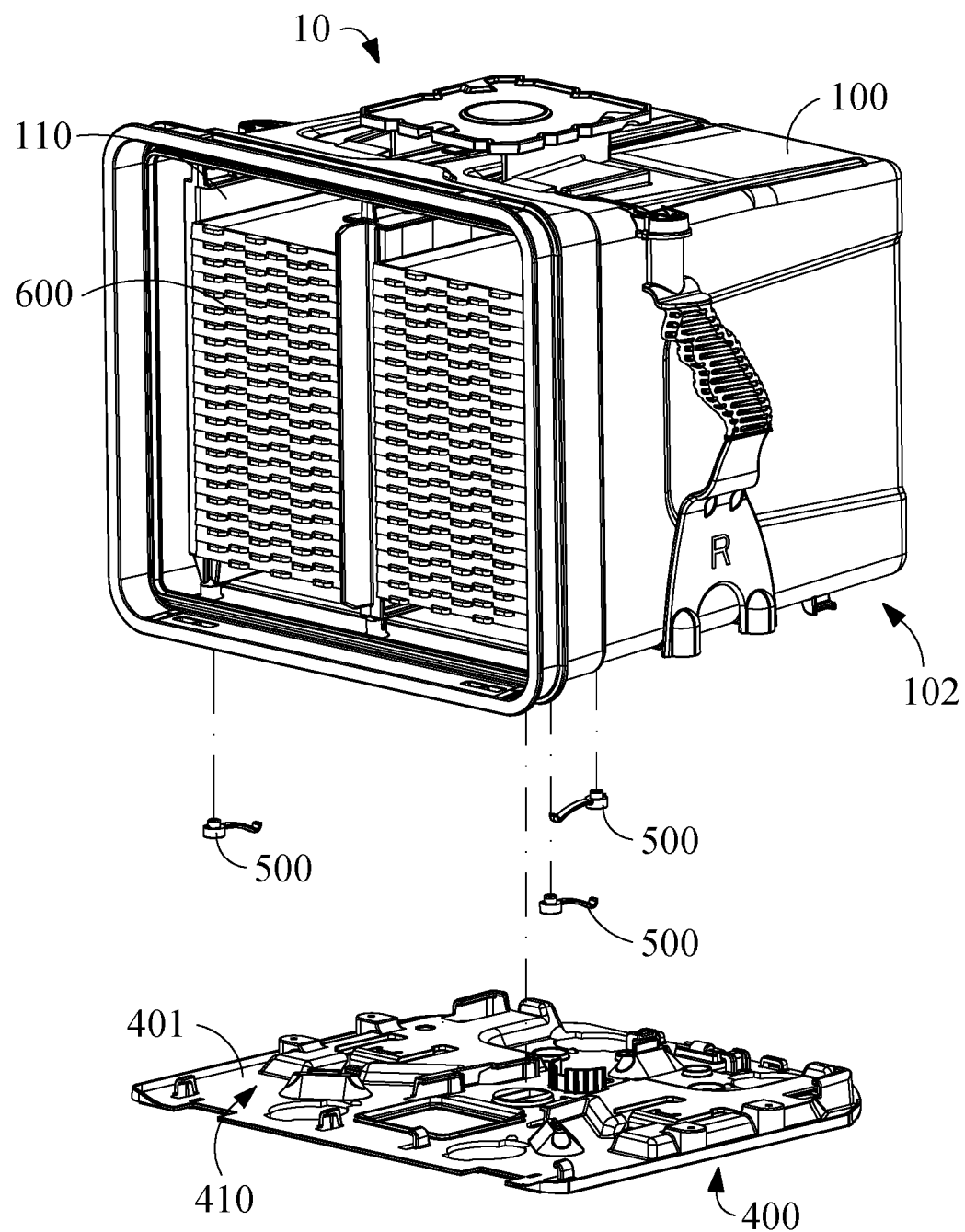
FIG. 10 is an exploded schematic diagram of a substrate container suitable for a protection device for a substrate container according to an embodiment of the present disclosure.
Figure 11:
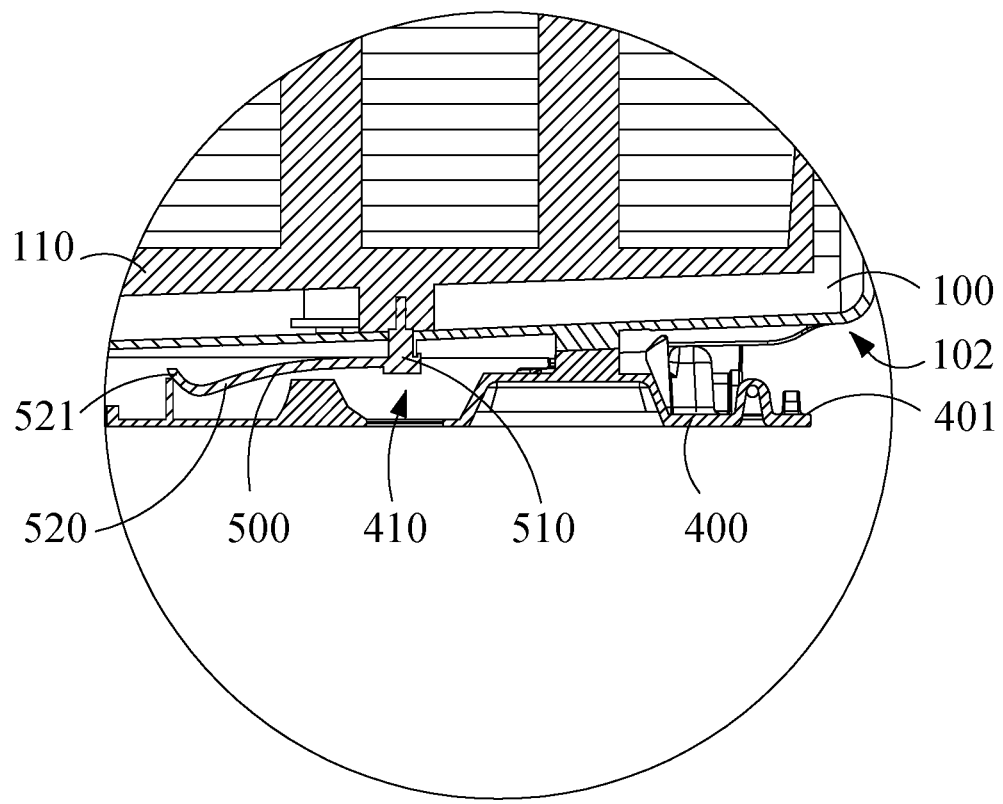
FIG. 11 is an illustrative enlarged schematic diagram of an electrical connection point of an antistatic element suitable for a substrate container with a support member and a base according to an embodiment of the present disclosure.
Figure 12:
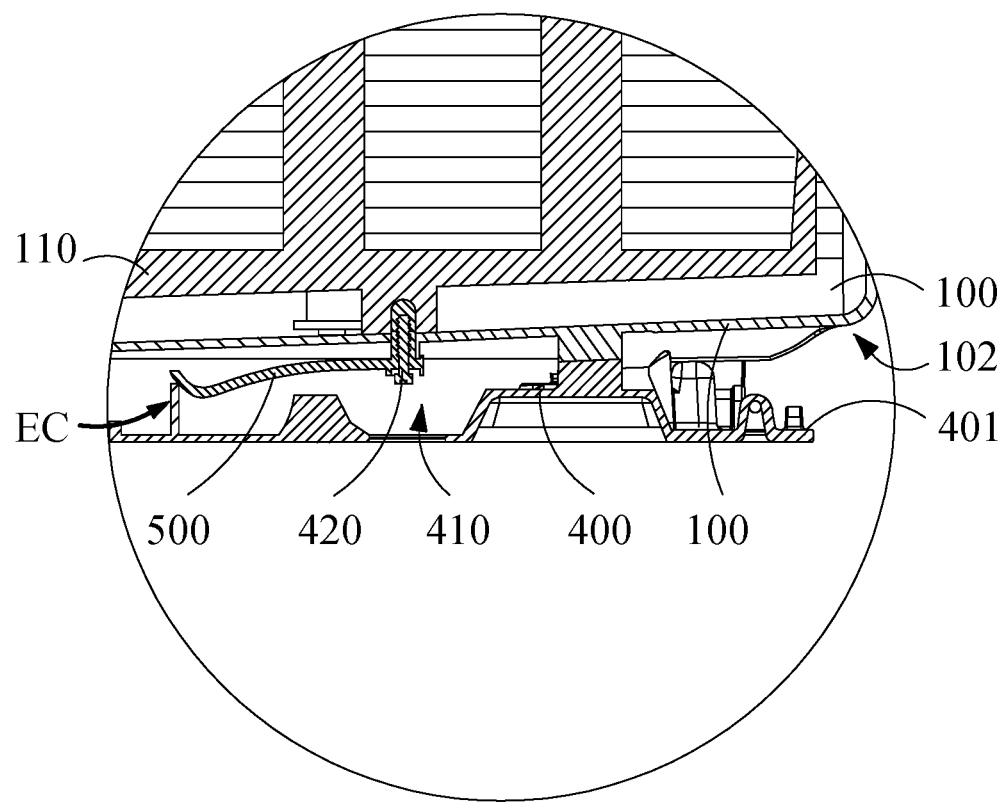
FIG. 12 is an illustrative enlarged schematic diagram of an electrical connection point of an antistatic element suitable for a substrate container with a support member and a base according to an embodiment of the present disclosure.
Figure 13:
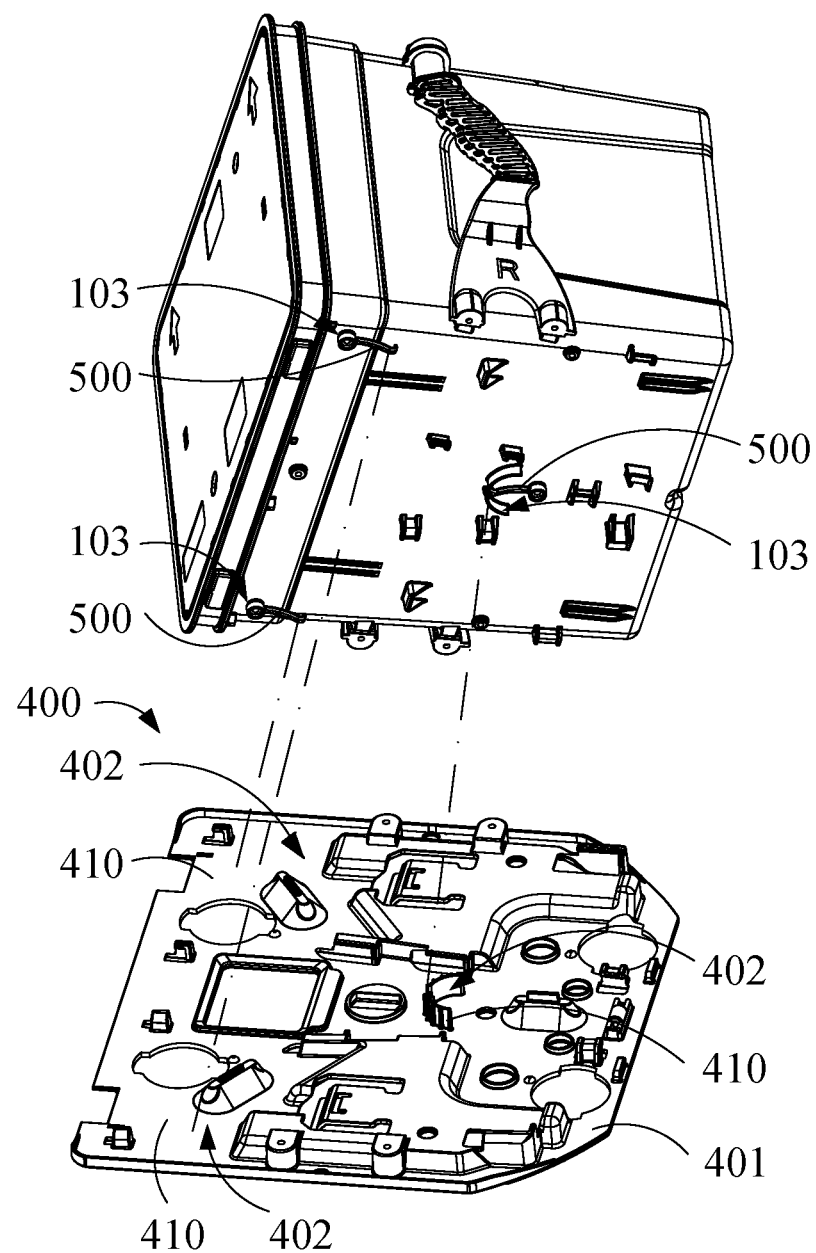
FIG. 13 is an exploded schematic diagram of a substrate container suitable for a protection device for a substrate container according to an embodiment of the present disclosure.

According to an embodiment of the present disclosure, a protection device for a substrate container is further provided to perform electrostatic protection for a substrate container. This embodiment is suitable for the substrate container, the limiter, and the support member described above, so the same element structures and the same element numerals and functions are omitted herein for brevity, and only the differences are described. Refer to FIG. 9 to FIG. 13. FIG. 9 shows a perspective schematic diagram of a substrate container 10 suitable for protection device for a substrate container according to an embodiment of the present disclosure. FIG. 10 shows an exploded schematic diagram of a substrate container suitable for protection device for a substrate container according to an embodiment of the present disclosure. FIG. 11 shows an illustrative enlarged schematic diagram of an electrical connection point of an antistatic element suitable for a protection device for a substrate container with a support member and a base according to an embodiment of the present disclosure. FIG. 12 shows an illustrative enlarged schematic diagram of an electrical connection point of an antistatic element suitable for a protection device for a substrate container with a support member and a base according to an embodiment of the present disclosure. FIG. 13 shows an exploded schematic diagram of a substrate container suitable for protection device for a substrate container according to an embodiment of the present disclosure. The substrate container 10 includes a container body 100, a base 400, and a support member 110. The base 400 is disposed at a bottom 102 of the container body 100. The support member 110 is disposed in a storage section 150 of the container body 100. The base 400 and the support member 110 are formed of electrostatic dissipative materials. The protection device for a substrate container includes an antistatic element 500 disposed between the bottom 102 of the container body 100 and the base 400. The support member 110 is electrically connected to the base 400 via the antistatic element 500. An electrostatic dissipation path is defined among the support member 110, the antistatic element 500, and the base 400, so as to electrically conduct and discharge charge from the base 400 to prevent charge from accumulating on the substrates 600 carried on the support member 110, hence achieving the function of electrostatic protection.

In an embodiment of the present disclosure, a plurality of antistatic elements 500 can be provided to electrically connect the support member 110 and the base 400, so as to divert electrostatic charge at different positions.

In an embodiment of the present disclosure, refer to both FIG. 10 and FIG. 13. The base 400 includes three positioning slots in a standard structural design to correspond to three positioning pins of a machine in order to position a substrate container on the machine. Thus, in avoidance from such standard structural conditions, a novel interference elimination structure 410 is designed in the present disclosure to install the antistatic element 500. The interference elimination structure 410 is disposed between the base 400 and the bottom 102 of the container body 100, so as to provide a novel function of an electrostatic dissipation path by means of disposing the antistatic element 500 in an interference-free manner without change the standard structures of the base 400 and the container body 100 accommodating the antistatic element 500. The interference elimination structure 410 is a flat unit without any protruding interference structure or is provided with a protruding conductive contact portion. The interference elimination structure 410 is correspondingly defined and formed corresponding to below one or more support members 110 of the container body 100, such that the antistatic element 500 is correspondingly disposed in the interference elimination structure 410 to correspond to the position of the support member 110.

In an embodiment, when there are two or more of both the antistatic element 500 and the support member 110, these antistatic elements 500 are arranged to correspond to respective positions of the support members 110, respectively, as shown in FIG. 10. In this embodiment, referring to both FIG. 10 and FIG. 13, three support members 110 distributed at intervals are provided in the container body 100, and are located on adjacent sides of the two groups of the plurality of substrates 600 stacked on one another. Below the support members 110 on two inner sides of the container body 100, the interference elimination structure 410 correspondingly located between the bottom 102 of the container body 100 and an inner surface 401 of the base 400 can be a flat unit. Below the support member 110 arranged at the center position of the container body 100, the interference elimination structure 410 correspondingly located between the bottom 102 of the container body 100 and an inner surface 401 of the base 400 can be provided with a conductive contact portion in a protruding manner. For example, the bottom 102 of the container body 100 is provided with a first conductive contact portion 103 in a protruding manner, the inner surface 401 of the base 400 is provided with a second conductive contact portion 402 in a protruding manner, and the first conductive contact portion 103 and the second conductive contact portion 402 are connected to each other to define a space for accommodating the antistatic element 500. Moreover, under conditions without interfering the structures of the container body 100 or the base 400, the support member 110 can be electrically connected to the base 400 to divert electrostatic charge to achieve an electrostatic dissipation path.

The structural design of the antistatic element 500 is further described in detail. As shown in FIG. 11, the antistatic element 500 includes a fixing portion 510 and an elastic connecting component 520. The fixing portion 510 is directly disposed at the bottom 102 of the container body 100 and is connected to the support member 110. One end of the elastic connecting component 520 is connected to the fixing portion 510, and the other end elastically pushes against the structure on the inner surface 401 of the base 400. Since a gap is present between the bottom 102 of the container body 100 and the inner surface 402 of the base 400, a height of the gap is sufficient from disposing the antistatic element 500. In order to maintain a continuous electrostatic dissipation effect, the elastic connecting component 520 has an elastic length and an elastic curvature, one end of the elastic connecting component 520 away from the fixing portion 510 is in contact with, pushes against, and is electrically connected to the inner surface 401 of the base 400, and a sufficient elastic interference distance is defined between the elastic length by which the elastic connecting component 520 extends and the inner surface 401 of the base 400. The elastic curvature of the elastic connecting component 520 is away from the fixing portion 510, and the elastic curvature pushes toward the inner surface 401 of the base 400 to elastically interfere with and divert accumulated electrostatic charge, at the same time reducing contact and friction and increasing movement smoothness. The elastic curvature is an upward hook feature 521 so as to readily increase a contact area for an electrical connection between the elastic connecting component 520 of the antistatic element 500 and the base 400.

In an embodiment of the present disclosure, as shown in FIG. 12, the antistatic element 500 further includes a conductive bridging component 420. The conductive bridging component 420 is for connecting the fixing portion 510 to the support member 110 via the bottom 102 of the container body 100. The fixing portion 510 is fixedly connected to and is kept in an electrical connection EC with the conductive bridging component 420. For example, the bridge connection member 420 is a metal screw, the fixing portion 510 has a screw hole (not shown), and the metal screw is correspondingly locked with the screw hole, such that the antistatic element 500 can be connected to the support member 110 via the bottom 102 of the container body 100. A top surface of the conductive bridging component 420 is lower than a height of a top surface of the fixing portion 510 toward the inner surface 401 of the base 400. The conductive bridging component 420 achieves the electrostatic protection for the support member 110 without coming into contact with the inner surface 401 of the base 400 and without directly receiving a force of interference. Since the conductive bridging component 420 of the present disclosure is directly connected to the support member 110 via the bottom 102 of the container body 100, assembly interference between the base 400 and the container body 100 is not affected. Thus, the present disclosure is able to solve the issues of a conventional method of using screws to directly lock a base to a support member through the bottom of a container body. The approach above can easily lead to changes in the height and internal dimensions of the support member, or structural interference such as deformation or displacement of the support member, or damage to the support due to the locking force of the screw, and hence the occurrence of anomalies and a reduced product yield rate.

The antistatic element 500 can have a different structural design and assembly means. For example, the fixing portion 510 of the antistatic element 500 sleeves the conductive bridging component 420, in a way that the fixing portion 510 is slidable up and down and is kept in an electrical connection. In another embodiment, one end of the conductive contact member 420 is connected to the support member 110 and the other end of the conductive contact member 420 is embedded in the container body 100, and the fixing portion 510 of the antistatic element 500 is embedded in the container body 100 and is electrically connected to the conductive bridging component 420. In yet another embodiment, the fixing portion 510 of the antistatic element 500 goes through the container body 100, and is directly fixed and electrically connected to the support member 110. Regardless of the structural designs and assembly means adopted by the antistatic element 500 above, any form in which the antistatic element 500 is disposed between a base and a container body and capable of solving the issue of electrostatic damage to substrates in a substrate container is to be encompassed within the scope of the protection of the present disclosure.

In an embodiment of the present disclosure, the antistatic element 500 is formed of an antistatic plastic having a carbon nanotube, such as antistatic PC.

In conclusion, with the protection device for a substrate container of the present disclosure, the improved structural design of the limiter is capable of solving the issue of a conventional substrate container including a limiter for pushing against a substrate. During the process of moving the door to interact with an automation system, interference results due to the limiter protruding from the inner surface of the door, further leading to the issue of an operation anomaly. Further, the present disclosure ensures that a substrate is clamped and fixed by a limiter without generating any displacement or vibration when the substrate is stored and carried in a substrate container, and the arrangement of the limiter does not cause any undesired interference between a mechanism and a component. Moreover, the support member with the coordination of the elastic connecting component and the rigid connecting component appropriately carries weight and is stably and fixedly connected to the container body without incurring issues of dust contamination or damage caused by gaps, vibration, or friction. Moreover, by using an elastic interference between the antistatic element of the protection device for a substrate container of the present disclosure as a connection for electrostatic dissipation (Electrostatic discharge protection, ESD), the present disclosure can use the elastic antistatic element as a bridge for an antistatic connection between the support member of the substrate container and the base. Thus, the objective of protecting the substrate in the substrate container is achieved, and safety of the substrate carried or transported in the container is also enhanced.

The present invention is described by way of the preferred embodiments above. A person skilled in the art should understand that, these embodiments are merely for describing the present invention are not to be construed as limitations to the scope of the present invention. It should be noted that all equivalent changes, replacements and substitutions made to the embodiments are to be encompassed within the scope of the present invention. Therefore, the protection of the present invention should be accorded with the broadest interpretation of the appended claims, so as to encompass all modifications and similar arrangements and processes.

What is claimed is:

1. A protection device for a substrate container, suitable for the substrate container, the substrate container including a container body and a container door, the container door adapted to be opened and closed with the container body, the container body provided therein with a storage section for accommodating a substrate, the protection device for a substrate container comprising:
    at least one support member, for being disposed at the container body;
    a recessed portion, for being provided at the container door; and
    a limiter, for being disposed at the recessed portion of the container door, the limiter including:
        a base, for being disposed at the recessed portion; and
        at least one movable piece, pivotally connected to the base, the movable piece comprising a pivot side and a free side, the pivot side for pushing against the at least one support member of the container body, the free side correspondingly extending outward according to a push force at the pivot side and pushing against the substrate, or the free side withdrawing inward, such that a height of a top surface of the limiter toward the storage section is less than a height of an inner surface of the container door.

2. The protection device for a substrate container according to claim 1, wherein the limiter further comprises an elastic element disposed between the base and the movable piece, and the elastic element provides an elastic variance for a movement state of extending the free side outward according to a push force at the pivot side or withdrawing the free side inward.

3. The protection device for a substrate container according to claim 1, wherein when a plurality of movable pieces is provided, the pivot sides of the plurality of movable pieces is in a staggered arrangement and are for pushing against the at least one support member located at the container body.

4. The protection device for a substrate container according to claim 1, further comprising:
    a fastening component, disposed at the recessed portion of the container door, and detachably installed with the limiter.

5. The protection device for a substrate container according to claim 1, further comprising:
    a limiting component, disposed at the recessed portion of the container door, for fixing the limiter.

6. A protection device for a substrate container, the substrate container comprising a container body and a container door, the container door adapted to be opened or closed with the container body, the container body comprising a plurality of card slots; the protection device for a substrate container comprising:
    the limiter according to claim 1;
    a plurality of support members, for supporting a substrate, each of the support members comprising:
        a protrusion, located on a top surface of the support member, the protrusion for correspondingly placing into the card slots;
        a reinforcement support portion, disposed on the protrusion, the reinforcement support portion comprising:
            a rigid connecting component; and
            an elastic connecting component, comprising an extension portion and a hooking portion, one end of the extension portion connected to the rigid connecting component, one other end of the extension portion connected to the hooking portion, the hooking portion hooked with the card slot of the container body, wherein a hardness of the rigid connecting component is greater than a hardness of the elastic connection.

7. The protection device for a substrate container according to claim 6, wherein the rigid connecting component is embedded in the protrusion.

8. A protection device for a substrate container, the substrate container comprises a container body, a base, and at least one support member, the base disposed at a bottom of the container body, the at least one support member disposed in an storage section of the container body, the base and the support member formed of electrostatic dissipative materials, the protection device for a substrate container comprising:

the limiter according to claim 1; and at least one antistatic element disposed between the bottom of the container body and the base, the antistatic element comprising:

a fixing portion, for disposing at the bottom of the container body, and connected to the at least one support member; and an elastic connecting component, having one end thereof connected to the fixing portion and one other end thereof elastically pushing against an inner surface of the base, wherein the at least one support member, the antistatic element, and the base define an electrostatic dissipation path.

9. The protection device for a substrate container according to claim 8, wherein the bottom of the container body and the base define an interference elimination structure, and the antistatic element is disposed at a position in the interference elimination structure.

10. The protection device for a substrate container according to claim 8, wherein when a multiple number of both of the antistatic element and the support member are provided, these antistatic elements are arranged to correspond to respective positions of the support members.

11. The protection device for a substrate container according to claim 8, wherein the antistatic element further comprises a conductive bridging component, and the conductive bridging component is for connecting the fixing portion to the at least one support member via the bottom of the container body.

12. The protection device for a substrate container according to claim 11, wherein a top surface of the conductive bridging component is lower than a height of a top surface of the fixing portion toward the base.

13. The protection device for a substrate container according to claim 11, wherein the bridge connection member is a metal screw, the fixing portion has a screw hole, and the metal screw is correspondingly locked with the screw hole, such that the antistatic element is connected to the at least one support member via the bottom of the container body.

14. The protection device for a substrate container according to claim 11, wherein the fixing portion is fixedly connected to the conductive bridging component.

\* \* \* \* \*